United States Patent [19]
Lim et al.

[11] Patent Number: 5,313,102
[45] Date of Patent: May 17, 1994

[54] INTEGRATED CIRCUIT DEVICE HAVING A POLYIMIDE MOISTURE BARRIER COATING

[75] Inventors: Thiam B. Lim, Pasir Ris Gardens; Tadashi Saitoh, Mandarin Garden; Boon Q. Seow, Greenridge Crescent, all of Singapore

[73] Assignee: Texas Instruments Incorporated, Dallas, Tex.

[21] Appl. No.: 455,210

[22] Filed: Dec. 22, 1989

[51] Int. Cl.[5] .................. H01L 23/28; H01L 23/48; H01L 29/44; H01L 29/52
[52] U.S. Cl. .................. 257/787; 257/666; 257/692; 257/696; 257/792; 257/778
[58] Field of Search ............ 357/72, 74, 80, 83, 357/70, 81; 257/783, 666, 668, 778, 676, 691, 692, 696, 782, 787, 792, 798, 659, 660

[56] References Cited
U.S. PATENT DOCUMENTS

| | | | |
|---|---|---|---|
| 2,809,332 | 10/1957 | Sherwood | 357/72 |
| 3,568,012 | 3/1971 | Ernst | 357/72 |
| 4,300,153 | 11/1981 | Hayakawa et al. | 357/72 |
| 4,535,350 | 8/1985 | Goodrich et al. | 257/783 |
| 4,621,279 | 11/1986 | Maier et al. | 357/83 |
| 4,826,297 | 5/1989 | Kubo et al. | 357/80 |
| 4,862,245 | 8/1989 | Pashby et al. | 357/70 |
| 4,891,687 | 1/1990 | Mallik et al. | 357/74 |
| 4,916,516 | 4/1990 | Ward | 357/81 |
| 4,916,519 | 4/1990 | Ward | 357/81 |
| 4,933,741 | 6/1990 | Schroeder | 357/70 |
| 4,937,656 | 6/1990 | Kohara | 357/70 |
| 4,965,654 | 10/1990 | Karner et al. | 357/70 |
| 4,974,057 | 11/1990 | Tazima | 357/70 |
| 5,012,322 | 4/1991 | Guillotte et al. | 257/783 |

FOREIGN PATENT DOCUMENTS
179554 1/1987 Japan.

OTHER PUBLICATIONS
I. Fukuzawa, et al., "Moisture Resistance Degradation of Plastic LSIs By Reflow Soldering", 1985 IEEE-/IRPS, pp. 192–197.

*Primary Examiner*—Andrew J. James
*Assistant Examiner*—Carl Whitehead, Jr.
*Attorney, Agent, or Firm*—Richard L. Donaldson; Wade J. Brady

[57] ABSTRACT

A semiconductor package device is disclosed. In one embodiment, attached by its active face to a lead-on-chip leadframe having leadfingers is an integrated circuit. The integrated circuit has a polyimide coating on its backside. An encapsulating material surrounds the integrated circuit and the lead-on-chip leadframe so that the leadfingers are exposed. The polyimide coating on the backside of the integrated circuit helps to reduce package cracking arising from mounting the device to a printed circuit board by relflow solder.

21 Claims, 4 Drawing Sheets

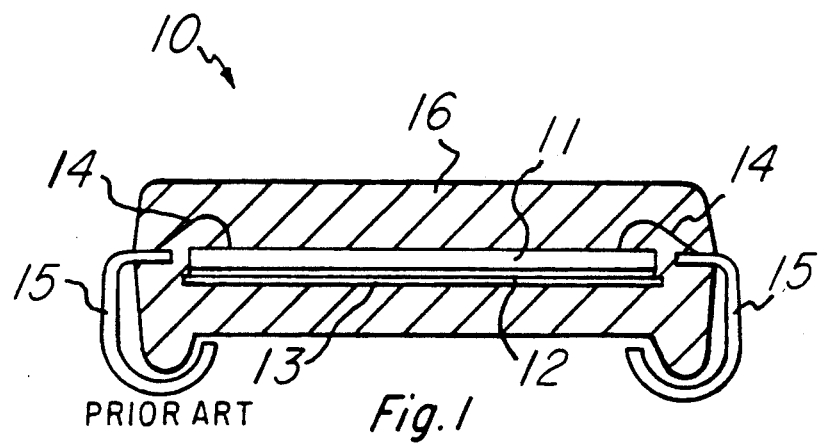
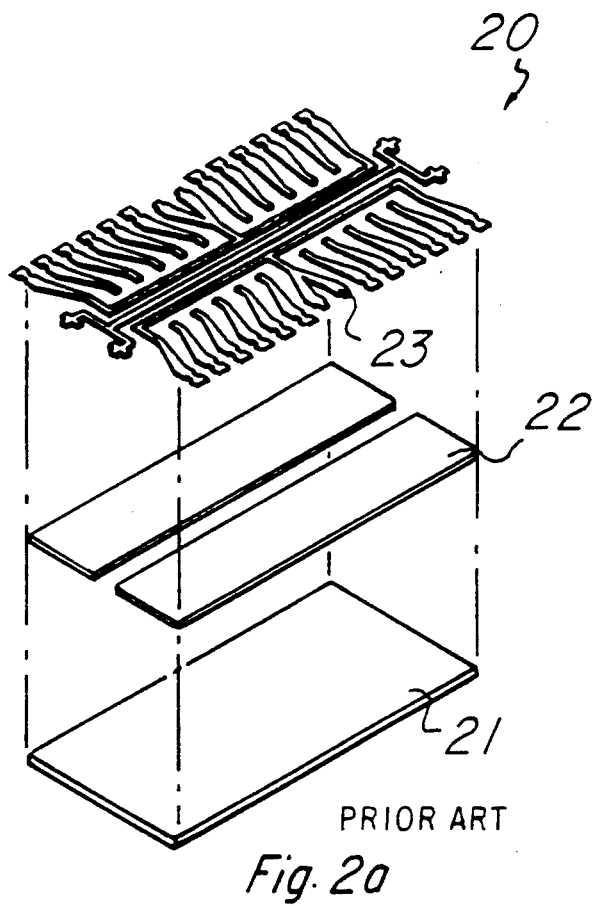

INTEGRATED CIRCUIT DEVICE HAVING A POLYIMIDE MOISTURE BARRIER COATING

FIELD OF THE INVENTION

This invention is related to semiconductor integrated circuit (IC) devices, and more particularly to an IC device without a chip support pad.

BACKGROUND OF THE INVENTION

An integrated circuit package generally includes an integrated circuit having an active face lying on a chip support pad connected to a leadframe and encapsulated by a substance, such as plastic, to protect the IC. The IC package is typically mounted to a printed circuit board. Reflow solder is one technique used to surface mount the IC package to a printed circuit board.

As the industry moves towards thinner (50 mils or thinner, for example) packages or a larger chip size for higher volumetric packaging on printed circuit boards, however, new packaging techniques are evolving. Two such techniques are the lead-on-chip technique and the chip-on-lead technique. In both the lead-on-chip technique and the chip-on-lead technique, a chip support pad is not used. A thinner package or one with a larger chip size results. However, a problem occurs when surface mounting a lead-on-chip device and a chip-on-lead device to a printed circuit board by reflow solder. The heat generated during reflow solder can enhance the state of thermal mismatch between the dissimilar materials n the IC package creating high stresses in the encapsulating material. Additionally, at reflow temperature (typically about 215° C. to 260° C.) any moisture that may have been absorbed by the encapsulating material is converted to steam. The steam pressure can be such that it delaminates the surface of the IC and the surface of the encapsulating material. The loss of adhesion under such conditions causes a high stress concentration in the encapsulant at the corner of the IC. This often leads to package cracking. As the area of the IC increases, cracking of the IC package in lead-on-chip and chip-on-lead devices resulting from reflow solder increases.

It is an object of this invention to provide a semiconductor integrated circuit that reduces cracking in a lead-on-chip and a chip-on lead package.

It is a further object of this invention to provide a lead-on-chip and a chip-on lead IC package that is resistant to cracking.

A further object of this invention is to provide a method of reducing cracking in a lead-on-chip and a chip-on-lead IC package.

Other objects and benefits of this invention will be apparent to those skilled in the art, based upon the description to follow herein.

SUMMARY OF THE INVENTION

A semiconductor package device is disclosed. In one embodiment, attached by its active face to a lead-on-chip leadframe having leadfingers is an integrated circuit. The integrated circuit has a polyimide coating on its backside. An encapsulating material surrounds the integrated circuit and the lead-on-chip leadframe so that the leadfingers are exposed. The polyimide coating on the backside of the integrated circuit helps to reduce package cracking arising from mounting the device to a printed circuit board by reflow solder.

BRIEF DESCRIPTION OF THE DRAWINGS

FIG. 1 is a cross section view of a typical IC package.

FIG. 2a is an exploded perspective view of a lead-on-chip device without an encapsulating material.

DETAILED DESCRIPTION OF SPECIFIC EMBODIMENT

Figure 2B:
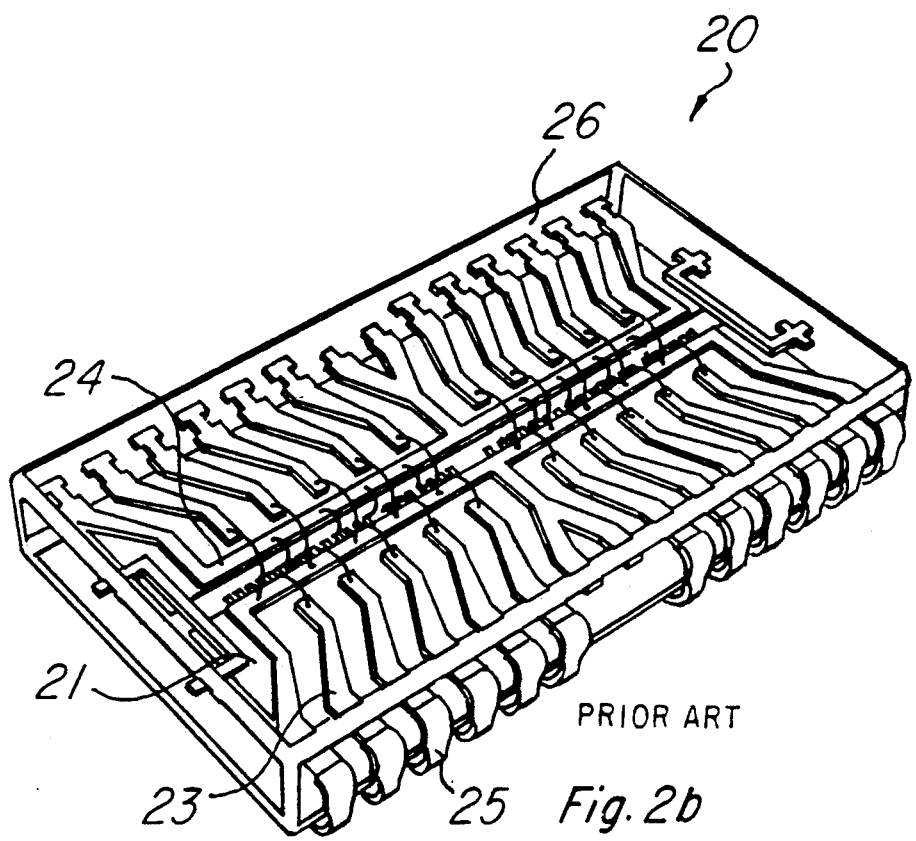
FIG. 2b is a view of a lead-on-chip package wherein the encapsulating material is rendered transparent.

FIG. 1 is a cross section view of a typical IC package device 10. IC package device 10 is illustrated in the conventional plastic small outline J-leaded (PSOJ) surface mount package. A semiconductor circuit (chip) 11 is positioned on a mount support pad (chip attach) 1 lying on a leadframe 13. Wirebonds 14 are connected near the outer edges of semiconductor chip 11 bonding semiconductor chip 11 to leadfingers 15. An encapsulating material 16, plastic for example, surrounds semiconductor chip 11, chip attach 12, leadframe 13, wirebonds 14, and parts of leadfingers 15 so that IC package device 10 of FIG. 1 can be surface mounted to a printed circuit board, not shown. A reflow solder process wherein IC package device 10 is subjected to temperatures ranging from about 215° C. to 260° C. is typically used to surface mount IC package device 10 to the printed circuit board.

FIG. 2a is an exploded perspective view of a lead-on-chip device 20 without an encapsulating material. A semiconductor circuit (chip) 21 is positioned below a lead-on-chip leadframe 23. A tape 22 lying between lead-on-chip leadframe 23 and semiconductor chip 21 helps to position and bond semiconductor chip 21 to lead-on-chip leadframe 23. A chip support pad is not used.

FIG. 2b is a view of lead-on-chip device 20 wherein an encapsulating material 26 is transparent. Wirebonds 24 are connected near the center of semiconductor chip 21 bonding semiconductor chip 21 to lead-on-chip leadframe 23. The leadfingers 25 of lead-on-chip leadframe 23 are curved in the "J" shape as in FIG. 1, however, leadfingers 25 of lead-on-chip frame 23 are an integral part of lead-on-chip frame 23.

Figure 2C:
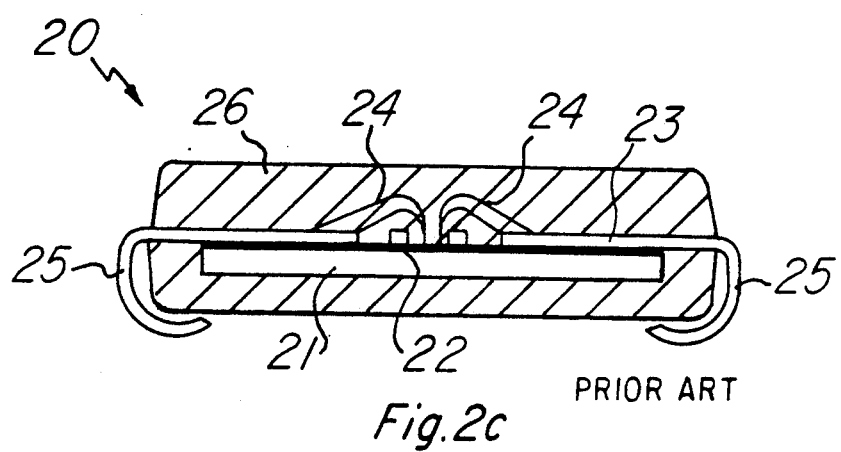
FIG. 2c is a cross section view of the lead-on-chip package of FIG. 2b.

FIG. 2c is a cross section view of lead-on chip package device 20. Leadfingers 25 are clearly shown as an integral part of lead-on-chip leadframe 23. Wirebonds 24 are clearly illustrated at the center of semiconductor chip 21 and lead-on-chip leadframe 23. An encapsulating material 26, plastic for example, surrounds semiconductor chip 21, tape 22, lead-on-chip leadframe 23, wirebonds 24, and parts of leadfingers 25 so that leadon-chip package device 20 can be mounted to a printed circuit board, not shown. A reflow solder process wherein lead-on-chip package device 20 is subjected to temperatures ranging from about 215° C. to 260° C. is typically used to surface mount lead-on-chip package device 20 to the printed circuit board.

Figure 3:
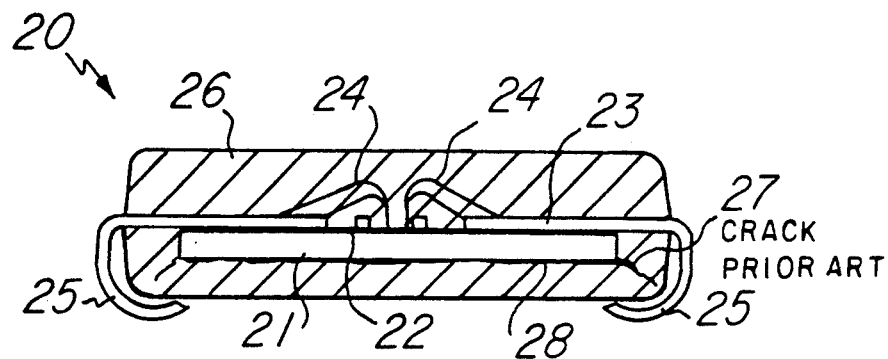
FIG. 3 is a cross section view of the lead-on-chip package of FIG. 2b illustrating a crack in the encapsulating material.

FIG. 3 is a cross section view of lead-on-chip package device 20 illustrating a crack 27 in encapsulating material 26. With the temperatures lead-on-chip package device 20 is subjected to during reflow solder, an enhanced state of thermal mismatch occurs between the dissimilar materials in the package creating high stresses. Moisture in lead-on-chip package device 10 is converted into steam during reflow solder. The ensuing steam pressure causes delamination (illustrated as space 28) between the inactive face of silicon chip 21 and encapsulating material 26. The loss of adhesion under such conditions creates a high stress concentration in the encapsulating material at the corner of chip 21 and causes crack 27.

Figure 4:
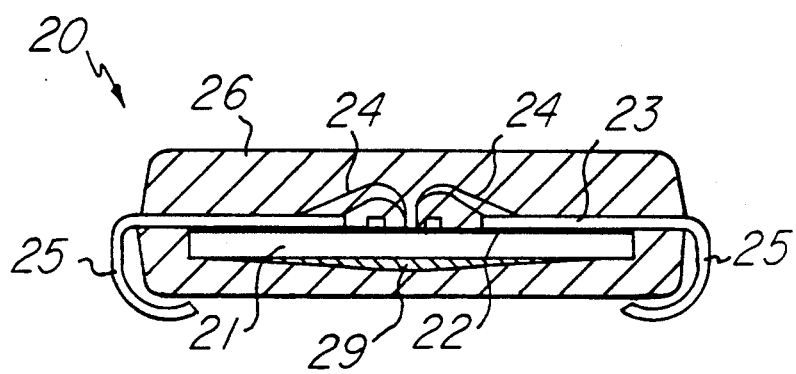
FIG. 4 is a cross section view of a lead-on-chip package illustrating a polyimide coating on the inactive face of the semiconductor chip.

FIG. 4 is a cross section view of lead-on-chip package device 20 illustrating the embodiment of the invention wherein a polyimide coating 29 is added to the inactive face of silicon chip 21. Any polyimide material may be used for polyimide coating 29. For instance, one example of a suitable polyimide material is the PIX 3400 of the P1Q series manufactured by Hitachi Chemicals. The thickness of polyimide coating 29 is not critical, although, enough polyimide to enhance adhesion should be utilized. Exemplary is a polyimide coating 29 ranging from about 6 to 75 microns. Polyimide coating 29 is added to ensure good adhesion between the inactive face of silicon chip 21 and encapsulating material 26. The presence of polyimide coating 29 forms a very strong bond between the inactive face of silicon chip 21 and encapsulating material 26. In addition to preventing delamination, the presence of polyimide coating 29 also avoids stress concentration in encapsulating material 26 at the corners of silicon chip 21 thus preventing cracking.

The application of polyimide coating 29 to lead-on-chip package 20 in FIG. 4 may advantageously occur at "back-end", during assembly, (ie., after bonding silicon chip 21 to lead-on-chip leadframe 23) or at "front-end" (ie., prior to dicing the silicon wafer into individual chips). Any suitable method may be used to apply polyimide coating 29 to the backside of silicon chip 21. Exemplary is the method wherein the polyimide is dispersed onto the backside of the chips after they have been dried and mounted on the lead-on-chip leadframe as in the "back-end" approach. Also exemplary is the method wherein the polyimide is dispersed on the backside of a silicon wafer before dividing it into individual chips as in the "front-end" approach. In the "back-end" approach, the vicosity and the surface tension of the polyimide form the curved profile of polyimide coating 29 shown in FIG. 4. In the "front-end" approach, the polyimide coating is flat since the wafers are spun to evenly spread the coating.

Test confirm that the addition of polyimide coating 29 to the backside of a silicon chip 21 of a lead-on chip package device substantially reduces package cracking. A test was used to simulate surface mounting IC packages that have moisture in them. Two different types of IC packages were used: a lead-on-chip package device as in FIGS. 2a-2c; and a lead-on-chip package device as in FIG. 4 wherein a polyimide coating was applied to the inactive face of silicon chip 21. The IC packages were 400 mils "PSOJ" type. Moisture was introduced into the IC packages followed by a reflow solder process. The IC packages were subjected to a 85C/85%RH environment for 168 hours, followed by a reflow solder process at 215° C.

Table 1 illustrates package cracking dependency on chip size using conventional lead-on-chip packages as in FIGS. 2a-2c. Table 2 illustrates the significant improvement gained in reduced package cracking through the addition of polyimide coating 29.

TABLE 1

| Chip size (×E-3 inch) | Pkg crack/ sample size | Die size (×E-3 inch) | Pkg crack/ sample size |
|---|---|---|---|
| 320 × 660 | 0/20 | 340 × 660 | 18/20 |
| 320 × 670 | 0/20 | 340 × 670 | 16/20 |
| 320 × 680 | 1/20 | 340 × 680 | 18/20 |
| 320 × 690 | 3/20 | 340 × 690 | 17/20 |
| 330 × 660 | 9/18 | 350 × 660 | 17/20 |
| 330 × 670 | 7/18 | 350 × 670 | 20/20 |
| 330 × 680 | 12/18 | 350 × 680 | 20/20 |
| 330 × 690 | 7/24 | 350 × 690 | 19/20 |

TABLE 2

| Chip size (×E-3 inch) | Pkg crack/sample size | |
|---|---|---|
| | Conventional | New |
| 330 × 660 | 43/172 | 0/99 |
| 350 × 690 | 19/20 | 0/12 |

The results in Table 1 reveal the susceptibility of the lead-on-chip package device 20 without the polyimide coating 29 to crack. For a combination of 16 silicon chip sizes subjected to such a surface mount stress simulation, only the 2 smaller sizes did not have package cracking. Repeated experiments showed that the addition of polyimide coating 29 eliminated package cracking. A comparison between the resilience of the lead-on-chip package device of FIGS. 2a-2c without polyimide coating 29 and lead-on-chip package device of FIG. 4 with polyimide coating 29 is illustrated in Table 2. With a silicon chip 21 size of 0.330×660 inches, 43 out of 172 samples without polyimide coating 29 cracked whereas 0 out of 99 samples with polyimide coating 29 cracked. In the case of the larger silicon chip 21 size of 0.350×0.690 inches, 19 out of 20 samples without polyimide coating 29 cracked whereas 0 out of 12 samples with polyimide coating 29 cracked.

Figure 5:
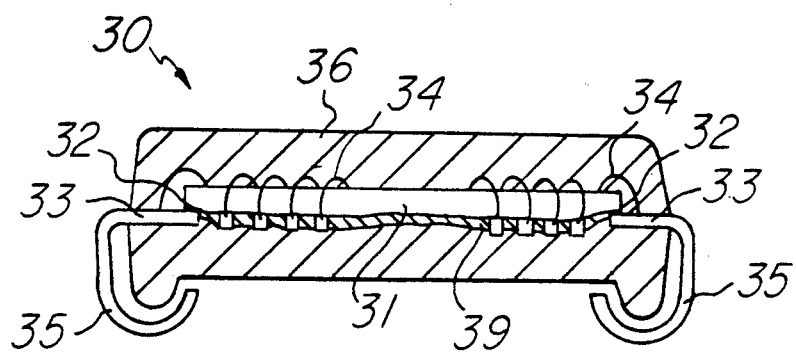
FIG. 5 is a cross section view of a chip-on-lead package illustrating a polyimide coating on the inactive face of the semiconductor chip.

FIG. 5 discloses another embodiment of the invention. FIG. 5 is a cross sectional view of a chip-on-lead package 30 wherein a polyimide coating 39 is applied to the backside of the silicon chip 31. No surface mount pad is used in this package device. The silicon chip resides over the chip-on-lead leadframe 31. A chip support pad is not used. The silicon die is placed over a chip-on-lead leadframe. A tape 32 lying between the semiconductor chip and the chip-on-lead leadframe helps to position and bond the semiconductor chip in place until it is bonded to the chip-on-lead leadframe. The active face of the silicon chip points towards the top of the package.

Figure 6:
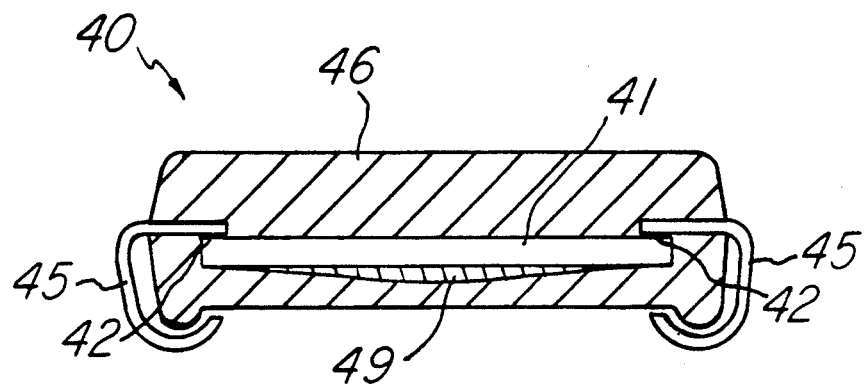
FIG. 6 is a cross section view of a tabpak package illustrating a polyimide coating on the inactive face of the semiconductor chip.

FIG. 6 is a cross sectional view of a tabpack package device wherein silicon chip 41 has a polyimide coating 49. In the tabpak package, a chip support pad is not used. Neither are wirebonds used. The leadfingers 45 extend above bonding pads 42 of silicon chip 41. Bonding pads 42 are bonded by fusion to leadfingers 15. A very thin package results. As in the lead-on-chip package devices, and the chip-on-lead packaged devices, polyimide coating 49 provides strong adhesion in the tabpak package and reduces package cracking.

Figure 7:
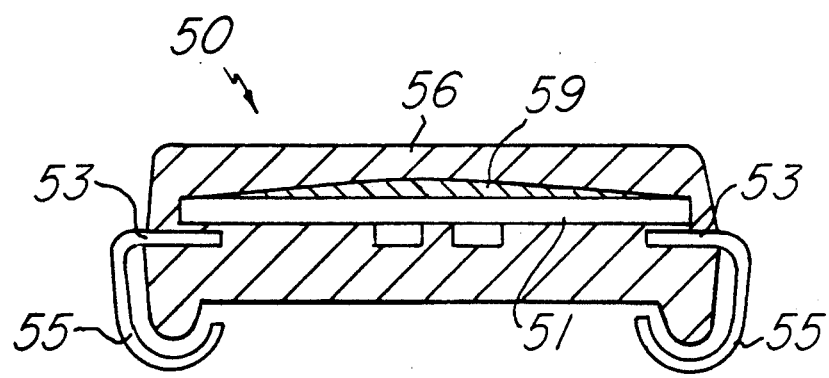
FIG. 7 is a cross section view of a flip-chip package illustrating a polyimide coating on the inactive face of the semiconductor chip.

FIG. 7 is a cross section view wherein a flip-chip package device 50 has a silicon chip 51 having a polyimide coating 59 on its backside. In the flip-chip package, a tape is not used, wirebonds are not used, and a chip mount pad is not used. The silicon chip is "flipped" so that its inactive backside points to the top. The leadfingers extend below bonding pads on the active face and are bonded by fusion.

While the addition of polyimide coating 29 serves to reduce package cracking, it also yields other advantages. There is no need for "drying", by baking, of the IC packages before surface mounting in order to avoid package cracking. There is also no need for "dry packing" (baking of the IC packages followed by placing them in hermetic bags) for shipment to customers.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A semiconductor integrated circuit adapted for mounting to a leadframe comprising:
   an integrated circuit having an active face and a backside, the active face attached to a leadframe;
   a plastic encapsulant, encapsulating the integrated circuit; and
   a polyimide coating on the backside of the integrated circuit between the backside and the encapsulant providing a moisture barrier and to prevent cracking of the encapsulant during mounting to a circuit board.

2. The semiconductor integrated circuit of claim 1 wherein the polyimide coating ranges from about 6 to 75 microns.

3. A semiconductor integrated circuit adapted for mounting to a chip-on-leadframe comprising:
   a plastic encapsulant, encapsulating the integrated circuit; and
   an integrated circuit having an active face and a backside, the active face attached to a chip-on-leadframe; and
   a polyimide coating on the backside of the integrated circuit between the backside and the encapsulant providing a moisture barrier and to prevent cracking of the encapsulant during mounting to a circuit board.

4. The semiconductor integrated circuit of claim 3 wherein the polyimide coating ranges from about 6 to 75 microns.

5. A semiconductor integrated circuit adapted for mounting to a tabpak tape comprising:
   a plastic encapsulant, encapsulating the integrated circuit; and
   an integrated circuit having an active face and a backside, the active face attached to the tabpak tape; and
   a polyimide coating on the backside of the integrated circuit between the backside and the encapsulant providing a moisture barrier and to prevent cracking of the encapsulant during mounting to a circuit board.

6. The semiconductor integrated circuit of claim 5 wherein the polyimide coating ranges from about 6 to 75 microns.

7. A semiconductor packaged device comprising:
   a lead-on chip leadframe having leadfingers;
   an integrated circuit having an active face and a backside, the active face attached to the lead-on-chip leadframe;
   a polyimide coating on the backside of the integrated circuit; and
   an encapsulating material encapsulating the integrated circuit, part of the leadfingers, and making intimate contact with and adhering to the polyimide coating on the backside of the integrated circuit.

8. The semiconductor package device of claim 7 further comprising:
   encapsulating material surrounding the integrated circuit and the lead-on-chip leadframe so that the leadfingers are exposed.

9. The semiconductor package device of claim 8 wherein the encapsulating material is plastic.

10. The semiconductor package device of claim 9 wherein the polyimide coating ranges from about 6 to 75 microns.

11. A semiconductor package device comprising:
    a chip-on-lead leadframe having leadfingers;
    an integrated circuit having an active face and a backside, the active face attached to the chip-on-lead leadframe; and
    a plastic encapsulant, encapsulating the integrated circuit; and
    a polyimide coating on the backside of the integrated circuit between the backside and the encapsulant providing a moisture barrier and to prevent cracking of the encapsulant during mounting to a circuit board.

12. The semiconductor package device of claim 11, further comprising:
    an encapsulating material surrounding the integrated circuit and the chip-on-lead leadframe so that the leadfingers are exposed.

13. The semiconductor package device of claim 12 wherein the encapsulating material is plastic.

14. The semiconductor package device of claim 13 wherein the polyimide coating ranges from about 6 to 75 microns.

15. A semiconductor package device comprising:
    a tabpak tap having lead fingers;
    an integrated circuit having an active face and a backside, the active face attached to the tabpak tape so that the leadfingers are exposed; and
    a plastic encapsulant, encapsulating the integrated circuit; and
    a polyimide coating on the backside of the integrated circuit between the backside and the encapsulant providing a moisture barrier and to prevent cracking of the encapsulant during mounting to a circuit board.

16. The semiconductor package device of claim 15 further comprising:
    an encapsulating material surrounding the integrated circuit and the tabpak tape so that the leadfingers are exposed.

17. The semiconductor package device of claim 16 wherein the polyimide coating ranges from about 6 to 75 microns.

18. A semiconductor package device comprising:

a flip-chip leadframe having leadfingers;

an integrated circuit having an active face and a backside, the active face attached to the flip-chip leadframe; and a plastic encapsulant, encapsulating the integrated circuit; and a polyimide coating on the backside of the integrated circuit between the backside and the encapsulant providing a moisture barrier and to prevent cracking of the encapsulant during mounting to a circuit board.

19. The semiconductor package device of claim 18 further comprising:

an encapsulating material surrounding the integrated circuit and the flip-chip leadframe so that the leadfingers are exposed.

20. The semiconductor package device of claim 19 wherein the encapsulating material is plastic.

21. The semiconductor package device of claim 20 wherein the polyimide coating ranges from about 6 to 75 microns.

* * * * *